(12) United States Patent
McCasland et al.

(10) Patent No.: US 11,901,722 B2
(45) Date of Patent: Feb. 13, 2024

(54) SYSTEMS AND METHODS FOR VERIFYING AND DE-ENERGIZING CIRCUIT PROTECTION DEVICES

(71) Applicant: TASCO, INC., Englewood, CO (US)

(72) Inventors: Steven Thomas McCasland, Highlands Ranch, CO (US); Ryan Charles Minnig, Englewood, CO (US)

(73) Assignee: TASCO, INC., Englewood, CO (US)

( * ) Notice: Subject to any disclaimer, the term of this patent is extended or adjusted under 35 U.S.C. 154(b) by 4 days.

(21) Appl. No.: 17/014,278

(22) Filed: Sep. 8, 2020

(65) Prior Publication Data

US 2021/0075207 A1 Mar. 11, 2021

Related U.S. Application Data

(60) Provisional application No. 62/896,425, filed on Sep. 5, 2019.

(51) Int. Cl.
| | |
|---|---|
| *H02H 3/04* | (2006.01) |
| *H02H 1/00* | (2006.01) |
| *G01R 31/327* | (2006.01) |
| *G01R 31/54* | (2020.01) |
| *H02H 5/04* | (2006.01) |

(52) U.S. Cl.
CPC ........... *H02H 3/04* (2013.01); *G01R 31/3277* (2013.01); *G01R 31/54* (2020.01); *H02H 1/0007* (2013.01); *H02H 5/047* (2013.01)

(58) Field of Classification Search
CPC ........ H02H 3/04; H02H 1/0007; H02H 5/047; H02H 5/04; G01R 31/3277; G01R 31/54
USPC ....................................................... 307/326
See application file for complete search history.

(56) References Cited

U.S. PATENT DOCUMENTS

| | | | |
|---|---|---|---|
| 2,947,937 A | 8/1960 | Ritcher et al. | |
| 3,532,967 A | 10/1970 | Milton et al. | |
| 5,270,658 A * | 12/1993 | Epstein | G01R 31/3272 324/424 |
| 5,272,438 A | 12/1993 | Stumme | |
| 5,710,513 A * | 1/1998 | March | G01R 31/3277 324/424 |
| 5,736,861 A * | 4/1998 | Keleher | G01R 31/52 324/424 |
| 6,049,143 A | 4/2000 | Simpson et al. | |

(Continued)

*Primary Examiner* — Thienvu V Tran
*Assistant Examiner* — Sreeya Sreevatsa
(74) *Attorney, Agent, or Firm* — Polsinelli PC (57) ABSTRACT

The present disclosure is directed to methods and apparatus that may collect information relating to a group of electrical power distribution wires, commonly referred to as an electrical branch circuit. Such methods can controllably cause a circuit breaker to open (clear) while keeping the branch circuit loaded within a predetermined set of parameters or specifications. Apparatus consistent with the present disclosure may use multiple high power resistive elements of different resistance values that are selectively connected to the branch circuit in a manner that provides a configurable limit to an available fault current when data relating to the branch circuit are collected and evaluated. Such methods can provide a positive indication to an electrician that allows the electrician to know that a particular electrical circuit has been de-energized before the electrician works on that particular electrical circuit.

20 Claims, 5 Drawing Sheets

(56) References Cited

U.S. PATENT DOCUMENTS

| | | | |
|---|---|---|---|
| 6,191,589 B1 | 2/2001 | Clunn | |
| 6,618,649 B1 | 9/2003 | Shilo | |
| 6,744,260 B2 | 6/2004 | Schmalz et al. | |
| 6,815,955 B1 * | 11/2004 | O'Neal, III | G01R 31/3277 |
| | | | 324/424 |
| 6,948,846 B2 * | 9/2005 | Engel | G01K 7/42 |
| | | | 374/E7.042 |
| 7,268,558 B2 | 9/2007 | Mills et al. | |
| 7,728,275 B2 * | 6/2010 | Blanchard | G01R 31/67 |
| | | | 250/214 SW |
| 7,791,346 B2 | 9/2010 | Waite et al. | |
| 2006/0209483 A1 * | 9/2006 | Hurwicz | G01R 31/3333 |
| | | | 361/115 |
| 2007/0047161 A1 * | 3/2007 | Mills | G01R 31/3277 |
| | | | 361/42 |
| 2013/0313088 A1 * | 11/2013 | Smith | H01H 9/167 |
| | | | 200/310 |
| 2015/0116881 A1 * | 4/2015 | Burnett | H02H 7/1227 |
| | | | 361/93.1 |
| 2016/0211101 A1 * | 7/2016 | Joao | H01H 71/04 |
| 2017/0345600 A1 * | 11/2017 | Naumann | H01H 71/40 |
| 2019/0162787 A1 * | 5/2019 | Hurwicz | H03K 17/08108 |

* cited by examiner

SYSTEMS AND METHODS FOR VERIFYING AND DE-ENERGIZING CIRCUIT PROTECTION DEVICES

CROSS-REFERENCE TO RELATED APPLICATION

This application claims benefit of priority to U.S. Provisional Patent Application No. 62/896,425, entitled "Systems and Methods for Verifying and De-Energizing Circuit Protection Devices" and filed Sep. 5, 2019, which is specifically incorporated herein in its entirety.

FIELD

The presently disclosed technology generally relates to systems and methods for verifying and de-energizing circuit protection devices and more particularly to opening (clearing) circuit breakers with an apparatus, such that a person may safely work on an electrical distribution system.

BACKGROUND

Before an electrician performs work on electrical branch circuits, those circuits are placed in a de-energized state for safety. An electrical branch circuit commonly includes a circuit breaker, power distribution wires, and one or more electrical outlets/sockets. Electrical branch circuits may also include a power distribution panel, lamps, or electrical appliances that are connected to the power distribution wires. The circuit breakers are safety devices that connect an incoming alternating current voltage (e.g. 120 V AC) supply source to the electrical distribution wires. The circuit breakers are designed to clear or switch to an open state when a fault condition occurs. Circuit breakers may open to disconnect an electrical connection between the voltage source and the electrical power distribution wires, thereby de-energizing the electrical power distribution wires and any electrical outlets/sockets or electrical equipment connected to the electrical power distribution wires. Commonly, a given electrical branch circuit may supply power to a portion of a house, a business, or an industrial manufacturing facility. A first electrical branch circuit may, for example, provide power to a kitchen area of a house and a second electrical branch circuit may provide power to the garage of the house. Electrical building codes/laws typically involve each different electrical branch circuit being protected by a single circuit breaker. Fault conditions that may cause a circuit breaker to open or clear include overcurrent, over temperature, an instantaneous surge current that generates a magnetic field, and/or the like.

A circuit breaker that provides power to an electrical branch circuit is generally placed in an open or cleared state when electricians work on or expand that branch circuit. However, the conventional process of clearing a circuit breaker typically involves techniques that do not always guarantee that particular electrical circuit outlets are de-energized. A common way to clear a circuit breaker is to approach a circuit breaker panel and switch a circuit breaker from an on-state to an off-state (or otherwise a cleared-state). The clearing process may include an electrician reviewing a written description of locations services by particular circuit breakers. For example, when a circuit breaker is labeled "kitchen" an electrician may assume that all electrical outlets in the kitchen of a house are connected to that circuit breaker. Commonly however, such descriptions may not be accurate. A particular outlet in the kitchen may be connected to a second circuit breaker and not the circuit breaker labeled "kitchen." Because of this, relying on written descriptions may result in a person working on an energized electrical circuit when that person believes that the electrical circuit has been de-energized. Such a mistake can lead to serious injury or death if the person were to touch an electrically energized wire or conductor.

Another way that some individuals clear a circuit breaker is by, for example, manually loading a circuit of interest to cause the circuit breaker to clear due to a thermal overload. Such a technique, is typically time consuming and will tend to generate a large amount of circuit and waste heat that may unnecessarily stress or degrade wiring or electrical connections in that circuit or circuit breaker box.

A third way that some individuals clear a circuit breaker is to provide a direct electrical short circuit at an electrical socket. In such instances, the person may connect a screw driver or other conductor to connect an energized or hot wire/conductor to a ground or neutral wire/conductor of an electrical branch circuit. Such a direct action can cause fires or generate sparks that can damage wiring or that can injure a person.

Even in instances where an electrician knows that a particular circuit breaker provides power to a specific electrical outlet, the electrician may have to walk long distances between the breaker box and the electrical outlet to work on the outlet. This can lead to delays and result in particular branch circuits being de-energized for longer than a predetermined or otherwise tolerable amount of time.

It is with these observations in mind, among others, that the presently disclosed technology was conceived and developed.

SUMMARY

Implementations described and claimed herein address the foregoing problems by providing systems and methods for clearing a circuit breaker. In one implementation, data associated with an electrical branch circuit is received and identified as within a tolerance range. The load may have been electrically connected based on the received data being within the tolerance range and the electrical connection is connected based on operation of a power semiconductor device. Additional data associated with the electrical branch circuit may also be received, and the circuit breaker is identified as cleared based on an evaluation of the additional data.

In another implementation, an apparatus includes a sensor that senses data associated with an electrical branch circuit, an electrical load, and a semiconductor device configured to electrically connect the electrical load to an energized wire of the electrical branch circuit. The apparatus may also include an electronic controller that receives the sensed data and that electrically connects the electrical load to the energized wire. The load may be electrically connected based on the received data being within the tolerance range. The controller may also evaluate additional data associated with the electrical branch circuit, and identify that the circuit breaker has cleared based on an evaluation of the additional data.

Other implementations are also described and recited herein. Further, while multiple implementations are disclosed, still other implementations of the presently disclosed technology will become apparent to those skilled in the art from the following detailed description, which shows and describes illustrative implementations of the presently disclosed technology. As will be realized, the presently disclosed technology is capable of modifications in various aspects, all without departing from the spirit and scope of the presently disclosed technology. Accordingly, the drawings and detailed description are to be regarded as illustrative in nature and not limiting.

DETAILED DESCRIPTION

The present disclosure is directed to methods and systems that collect information relating to a group of electrical power distribution wires, commonly referred to as an electrical branch circuit. Such methods controllably cause a circuit breaker to open (clear) while keeping the branch circuit loaded within a predetermined set of parameters or specifications. Apparatuses and systems consistent with the present disclosure use multiple high power resistive elements of different resistance values that are selectively connected to the branch circuit in a manner that provides a configurable limit to an available fault current when data relating to the branch circuit are collected and evaluated. Such methods provide a positive indication to an electrician providing confidence that a particular electrical circuit has been de-energized before the electrician works on that particular electrical circuit. The clearing of a circuit breaker may be identified by measuring a voltage at a previously energized wire of a branch circuit and by identifying that the wire no longer is connected to an alternating current voltage power source. For example, the clearing may be identified by initially measuring a voltage of 120 volts AC on a wire that is designated as being a "hot" wire and then by identifying that the 120 volts AC is no longer present on the "hot" wire. A "hot" wire is a wire that is designated by electrical code to be configured to conduct an AC voltage from one point to another in an electrical branch circuit.

In addition to de-energizing the circuit, the circuit path is also verified by clearing the circuit breaker. The presently disclosed technology may be attractive to anyone who wants to perform work on or verify the circuit path of a branch electrical circuit. It will also be understood that, in addition to verifying and de-energizing circuit protection devices, the presently disclosed technology can be used to supply a controlled electrical load to a variety of electronic and electrical devices.

The present disclosure is directed to methods, systems, and apparatuses that collect information relating to an electrical branch circuit and controllably cause a circuit breaker to open, while keeping the branch circuit loaded within a predetermined set of parameters or specifications. Apparatuses consistent with the present disclosure utilize multiple high power resistive elements of different resistance values that are selectively connected to the branch circuit in a manner that provides a configurable limit to an available fault current.

In one implementation, the process of selectively connecting power to a branch circuit includes applying a load during a partial portion or phase of a power cycle to limit an amount of current through a branch circuit. For example, power may be applied during a first third of a power cycle as an alternating voltage crosses a baseline voltage of zero volts. Alternatively or additionally, power may be applied at a time when the alternating voltage is near a peak value (e.g. at a voltage that is 85% of a peak voltage). Such applications of power allow for a finer degree of control. Similar to the aforementioned phase control, pulse width modulation (PWM) of the load provides a method to interpolate current draw for a finer degree of control. An insulated gate bipolar transistor (IGBT) or other semiconductor switching device may be used to pass or block voltage to a load when a branch circuit is evaluated or when a circuit breaker is cleared.

Another way to limit an amount of fault current includes one or more semi-conductive devices operating in the active region capable of variable resistance control. Semiconductors operating in the active region exhibit a voltage or current controlled resistance which is between the saturation and cutoff points of the semiconductor. An IBGT may be biased in a state of conduction where a resistance between an emitter and a collector of the IBGT is controlled with a gate voltage. For example, the gate voltage of the IBGT can be used to control the emitter to collector resistance within a range of 0.10 and 0.20 ohms when the IBGT acts as a load to on a branch circuit.

In certain instances, a circuit which has a relatively high resistance is associated with a lower fault current. For example, when a fault current is below a magnetic trip threshold of a magnetic circuit breaker connected to the circuit of interest. Methods and apparatus consistent with the present disclosure may include one or more reactive elements (e.g. capacitors C, inductors L, or L/C combinations). In such instances, capacitive or inductive circuit elements will typically be controllably charged or discharged to help force the circuit breaker to open or clear. A capacitor charged with energy when an alternating voltage rises above zero volts and may be discharged back into the branch circuit later when the alternating voltage moves below zero volts, for example. Such techniques use semiconductors of various sorts to selectively connect and disconnect inductive and or capacitive elements to increase an amount of inflow current or to increase an amount of outflow current. This technique may result a branch circuit current being opposed or supplemented by using one or more electrically reactive elements by storing and releasing energy to the branch individually or in combinations during specific portions of a power cycle. Since conventional AC power distribution circuits distribute power using a voltage that changes according to a sine wave that repeats approximately 50 or 60 times a second, various different levels of voltage may be applied to a load during selected portions of the sine wave.

Implementations of the presently disclosed technology use sensors to collect data regarding conditions of a particular branch circuit when an overall resistance of a branch circuit is identified. In such an instance, a voltage at an electrical receptacle is measured under a no-load condition, a known resistive load is applied to the circuit, and a voltage drop across the known resistive load is measured when identifying a voltage dropped across the known resistive load. Ohms law is applied to identify a load current flowing through the branch circuit and a resistance of the branch circuit may be identified. The load current is identified by the equation (formula 1): (load current)=(voltage drop)/(known resistive load). Next the branch circuit resistance may be identified by the equation (formula 2): (branch circuit resistance)=[(no-load voltage)−(voltage drop)]/(load current). This method may be characterized as voltage controlled phase feedback loop that identifies impedance characteristics of a branch circuit such that a circuit breaker of that branch circuit can be controllably cleared.

Alternatively or additionally, thermal measurements of the loading circuitry (e.g. a resistive load) may be analyzed when identifying thermal characteristics of a branch circuit or a load. In non-superconducting devices, current flow causes heat generation. A thermal measurement array that monitors thermal characteristics of the circuit of interest gives the user insight into changing thermal attributes of the circuit. In such instances, thermocouples or thermal imaging sensors are used to identify an under or over current condition based on a set of parameters.

Methods and apparatus consistent with the present disclosure also include communicating with electronic devices wirelessly. For example, an apparatus that clears a circuit breaker communicates with a cell phone when a load on a branch circuit is activated from a location distant to the apparatus. Data received from the apparatus may be displayed on a display of the cell phone and the data can relate to or identify a state of a branch circuit or circuit breaker. The state information is also used in certain instances to identify that the circuit breaker has cleared, may identify a resistance of the branch circuit, or may identify a fault condition.

In certain instances, one or more attempts to clear a circuit breaker does not result in the circuit breaker opening. Because of this, implementations of the present technology limit a number of clearing attempts per unit time. This may be true either when a series of clearing attempts are performed automatically or when those attempts are performed based on receiving user input. Limiting the number of attempts to clear a circuit breaker during a use session (or span of time, e.g. a three minute period) will help prevent an excessive amount of heat being built up in a branch circuit or at a load.

Methods consistent with the present disclosure may also identify whether a particular branch circuit is being fed by a suitable amperage circuit breaker. For example, branch resistances and currents are sometimes used to identify that a branch circuit rated at 15 amps is serviced by a breaker that clears when a current is near 15 amps. When measurements indicate that the 15 amp breaker is not clearing in a manner consistent with typical 15 amp breakers, these measurements may indicate that the breaker feeding the branch circuit has characteristics consistent with a 20 amp breaker, for example.

During a use session a user may encounter a circuit that is inadvertently and/or unknowingly fed by more than one circuit breaker. In this case, a change in circuit impedance during a use session will tend to indicate that one of the circuit breakers has cleared and another has not. A method to determine if more than one circuit breaker is feeding the circuit of interest helps with troubleshooting undesired circuit behavior. When a branch resistance is identified as having changed impedance, a warning indicator or message provided to a user indicating that the branch circuit appears to be fed by more than one circuit breaker, the information could then be considered by the user before taking any further action. This is because the change in branch circuit resistance combined with a continued presence of a voltage (e.g. 120 volts AC) on a wire that is classified as a "hot wire" is likely the result of a clearing of one circuit breaker and not another.

During the course of the user clearing more than one circuit breaker within a given period of time, waste heat will tend to build up in the load of the device. The presently disclosed technology provides the user as much use of the tool as possible within the period of time that the user wishes to use the device. While passive cooling that transfers heat to the ambient environment without mechanical aid, such passive cooling will typically not transfer heat as efficiently as desired. Because of this, a space efficient way to move heat from one location to another can be used to transfer heat, for example a Peltier junction or a thermoelectric device can be used to convert heat to electricity to power an apparatus consistent with the present disclosure. Alternatively, a Peltier or thermoelectric device can be used to move heat to the surrounding environment.

Given the condition that the circuit of interest is energized prior to the introduction of the device to the circuit of interest, a way to power the circuitry of the device is by converting heat from the circuit to which the device is attached to appropriate levels of electrical power needed by the internal circuitry. During a use session, the circuit breaker feeding the circuit of interest is cleared, thereby removing power from the branch circuit. As mentioned above, a method to extract power from the waste heat generated during the clearing process with Peltier junction, thermopile, or other a thermoelectric generation device provides an auxiliary power source when the main power is not available.

The use cases for the apparatus vary depending on the desires of the user. In a simple case the user may wish to perform work on a single receptacle or circuit. In this case, the user has to simply clear one circuit breaker. The energy buildup in the form of heat in the load is at the minimal end of the allowable scale. In a similar situation and for various reasons, the circuit may take multiple attempts to clear the circuit breaker. The waste heat buildup in the load can reach a level when the heat cannot be dissipated to the environment thru passive means at a sufficient rate to allow subsequent use of the apparatus. When connected to a circuit that is energized, an active cooling device, such as a thermoelectric generator can be used in the reverse operation to move heat away from the load source to the environment.

Building on the use of the thermoelectric generator used in reverse for active cooling is the use of the thermoelectric generator to provide power to the circuitry when the MAINS power is not present. The primary use of the apparatus is to start with a circuit which is energized and end with a circuit that is de-energized. When the circuit becomes de-energized, the internal circuitry has only a limited amount of residual energy available to operate. The circuitry operates after the de-energizing of the circuit without the introduction of internal batteries. When the temperature differential between the environment and the load is sufficiently large, electrical energy can be generated with a thermoelectric generator to prolong the operational time of the internal circuitry. A property of many thermoelectric generators is that they can be used to covert electrical energy to a temperature differential and they can work in reverse to convert a temperature differential into electrical energy. The property allows the same device which serves the purpose of active cooling in the above case to be used as the thermal power generation device when the circuit becomes de-energized.

Figure 1:
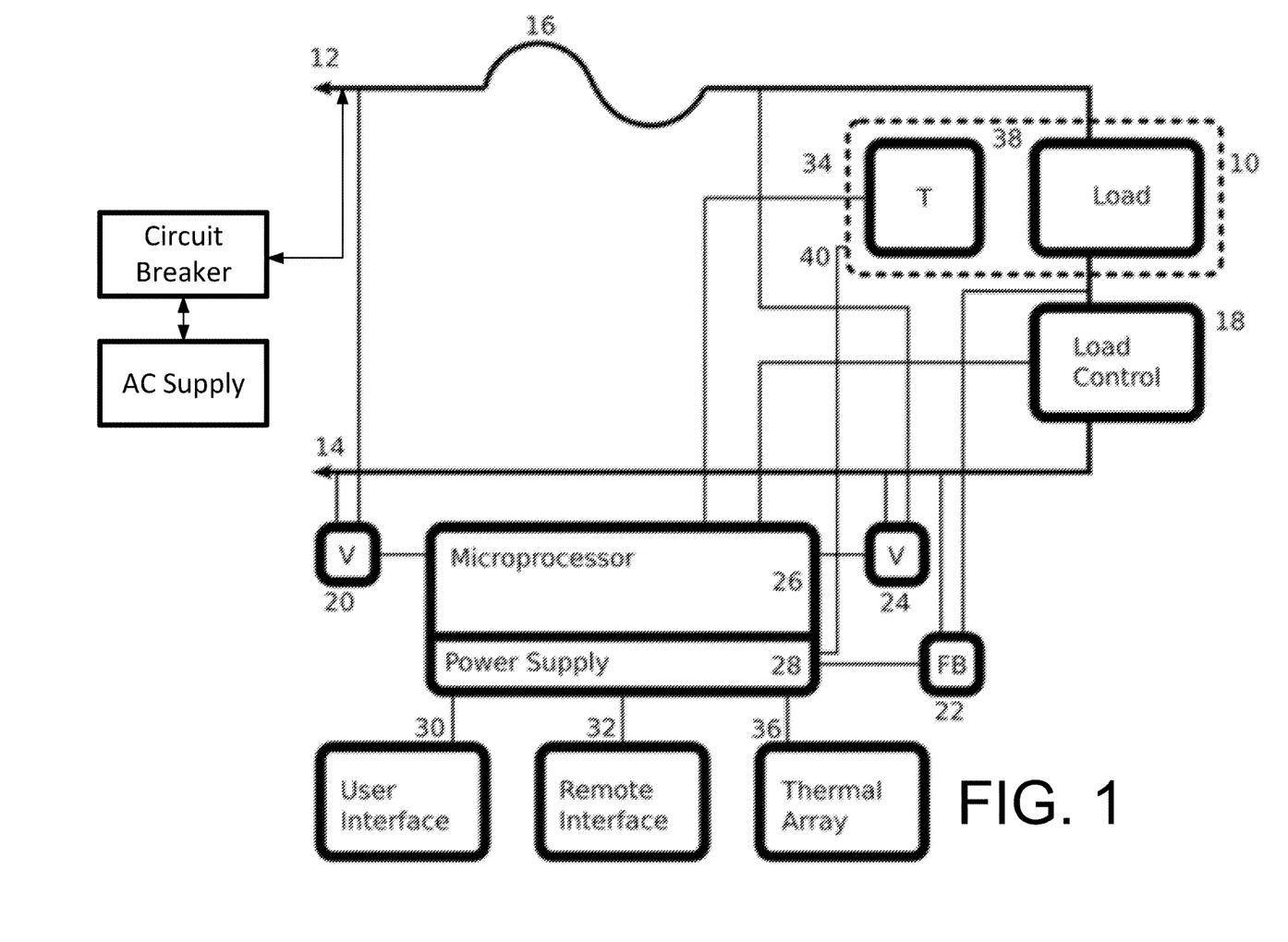
FIG. 1 illustrates an apparatus that can evaluate characteristics of an electrical distribution circuit and that can be used to clear a circuit breaker.

FIG. 1 illustrates an apparatus that can evaluate characteristics of an electrical distribution circuit and that can be used to clear a circuit breaker. FIG. 1 includes a load 10, probes 12 & 14, fuse 16, load control 18, probe voltage 20, load feedback 22, fuse monitor 24, microprocessor 26, power supply 28, user interface 30, remote control interface 32, thermal feedback 34, provided by thermal coupling/sensor (T) 38, thermal power generator 40, and thermal array 36. Fuse 16 will typically be used to protect the apparatus from receiving an amount of current that could damage components of the apparatus.

Fuse 16 can be used as a mechanism to protect internal circuitry in event of unforeseen variables, a protective fuse element is incorporated as part of the load circuitry. The fuse is chosen so as to have the desired $I^2t$ (current-squared time) characteristics pertinent for the expected current characteristics of the load. The $I^2t$ characteristic describes the current squared time factor, or total energy sufficient to melt the fusing element, which is a lesser known attribute of fuses aside from the standard current and voltage rating. $I^2t$ is a factor of the amount of current during an amount of time which when exceeded the fuse will clear. With a sufficiently high $I^2t$ attribute, the fuse is capable of withstanding sufficiently short but yet high current pulses that are above the current rating. In the event the fuse is cleared, the user is notified of such condition. While a fuse is used in this example implementation, a circuit breaker, resettable fuse, and/or the like having clearing characteristics chosen for the desired current may be used.

Generally, the load control 18 and feedback 22 circuit keep the current within a predefined set of parameters. The load 10 may contain switched reactive elements to overcome certain branch circuit conditions. The load 10 will typically be monitored by microprocessor 26 for thermal performance. An indicator 30 is presented to the user to alert of a cleared circuit protective element. This can include receiving data or a voltage from temperature sensor (T) 38 via thermal feedback connection 34. Remote interface 32 can be a communication interface that sends data to and that can receive instructions from other computing devices. Remote interface 32 can be a wireless interface or may be a wired interface consistent with any standard or custom communication interface used in the art. Communication interface 32 may allow remote electronic devices to remotely monitor and/or activate the controlled load 10 and/or thermal array 36. Active cooling can be provided by the application of electrical energy from the power supply 28 through the thermal power generator 40 to the thermal connection 38. The active cooling can prevent heat from collecting at load 10. The reverse operation of heat from the load 10 through the thermal connection 38 to the thermal power generator 40 can be used to provide power to power supply 28. This can result in waste heat providing power to power supply 28 when the circuit breaker is in a cleared state.

Microprocessor 26 may execute instructions out of a memory when collecting data from temperature sensors, when monitoring voltages, when calculating branch circuit resistances, or when clearing a circuit breaker. While microprocessor 26 is illustrated as performing steps consistent with the present disclosure, an electronic controller consistent with the present disclosure may not include a processor or may include both computing logic and a processor. As such, electronic controllers consistent with the present disclosure can include discrete logic, programmable logic, a field programmable gate array (FPGA), an application specific integrated circuit (ASIC), or other electronic hardware.

Figure 2:
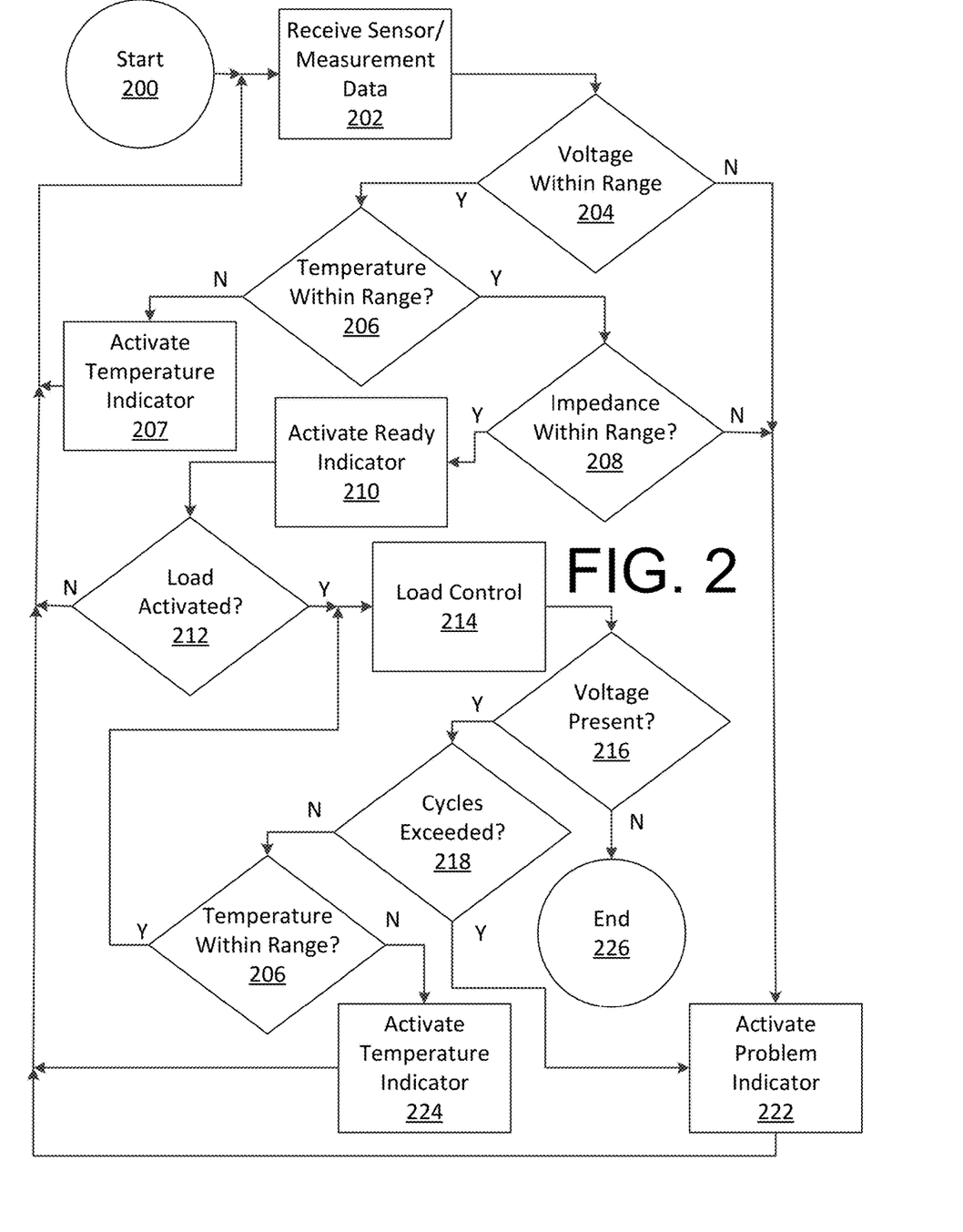
FIG. 2 illustrates a series of steps that may be performed when characteristics of an electrical branch circuit are identified and when a circuit breaker is cleared.

FIG. 2 illustrates a series of steps that can be performed when characteristics of an electrical branch circuit are identified and when a circuit breaker is cleared. The steps of FIG. 2 start at step 200 after a de-energizing circuit protection device has been plugged into an electrical outlet or otherwise connected to an electrical branch circuit. After step 200, sensor or other measurement data are received in step 202 of FIG. 2. The sensor or measurement data can be received by microprocessor 26 of FIG. 1.

A decision regarding whether the circuit condition meets the criteria to allow a circuit breaker to be cleared can depend on a number of factors including identifying whether a voltage falls within a predetermined range. The identification may include measuring an open circuit voltage on an energized wire of a branch circuit to see if that voltage is within a percentage (e.g. five percent) of a rated voltage (e.g. 120 volts AC). Determination step 204 identifies whether a voltage supplied to an electrical socket is within the predetermined range, when no program flow moves to step 222 where a problem indicator is activated. Step 222 may include illuminating a fault light, displaying a fault message on a display, providing an audio indication of the fault, or may include sending data to another computing device that in turn may warn a user of the fault condition.

When step 204 identifies that the voltage is within the predetermined range, program flow moves to determination step 206 that identifies whether a temperature is within another predetermined range. The step 206 may identify whether a temperature of a load resistor has reached a threshold temperature. For example, a temperature of 140 degrees Celsius or greater may correspond to a temperature that is considered to correspond to an out of range temperature. Determination step 206 identifies that a temperature is out of range based on data received from temperature sensor (T) 38 or may be based on another sensed temperature. When determination step identifies that the temperature is not within the predetermined range, program flow moves to step 207 where a temperature indicator is activated. Step 207 may include illuminating a fault light, displaying a fault message on a display, providing an audio indication of the fault, or may include sending data to another computing device that in turn may warn a user of the fault condition.

When determination step 206 identifies that the temperature is within the predetermined temperature range, program flow moves to determination step 208 that identifies whether an impedance is within range. Determination step 208 identifies a resistance or other impedance of a given branch circuit. Such a resistance value may be identified by processor that receives voltage measurements and performs calculations, such as the calculations of formula 1 and formula 2 reviewed above. When determination step 208 identifies that the impedance/resistance is not within range, program flow moves to step 222 where the problem indicator is activated. A branch circuit with a resistance of greater than 0.50 ohms or greater, for example, may be considered to exceed the impedance/resistance that is not within range.

When determination step 208 identifies that the impedance/resistance is within range, program flow moves to step 210 where a ready indicator is activated. Step 210 may include illuminating a ready light, displaying a ready message on a display, providing an audio indication of the ready condition, or may include sending data to another computing device that in turn may inform a user of the ready condition.

After the ready state is reached in step 110, program flow moves to determination step 212 that identifies whether a load has been activated. This may include validating that the load has been switched into the branch circuit in an appropriate manner and may include identifying that no other fault condition has occurred. When determination step 212 identifies that the load is not activated program flow may move from step 212 to step 202 where additional sensor and measurement data may be received.

When determination step 212 identifies that the load has been activated, program flow moves to step 214, where the load is controlled. It will be understood that an automatic mode is contemplated to control a load activation device, such as load control 18 of FIG. 1 by microprocessor 26 executing instructions out of a memory. When the load is activated, a load applied to the branch circuit is controlled. This process may include providing different resistive loads to the branch circuit or may include providing energy from a capacitor, an inductor, or from an LC circuit. This process may also include applying a controlled load while sequentially checking if the voltage is still present. Determination step 216 identifies whether a voltage is still being provided to the branch circuit. When determination step 216 identifies that the voltage is no longer present, a processor may identify that a circuit breaker of the branch circuit has opened/cleared and program flow ends at step 226. Step 226 may also include providing an indication or a message to a user indicating that the branch circuit has been cleared. The indication can identify that the user can safely work on the branch circuit without worrying about being shocked.

When large currents pass thru resistive elements, whether the element is intentionally or parasitically resistive, relatively high amounts of heat are commonly generated. The amount of heat is in proportion to the amount of power being dissipated and a function of the thermal conductivity to the surrounding area. The signature of the thermal radiation can be compared to a set of parameters to terminate or extend the current draw based on the initial set of parameters. In instances when multiple attempts to clear a circuit breaker (i.e. when multiple clearing cycles) are performed, heat can build up. In order to prevent a temperature from reaching a threshold level, a number of clearing cycles can be limited to a specified number of cycles.

When determination step 216 identifies that the voltage is still present, program flow moves to determination 218 that identifies whether a number of clearing cycles has met a threshold level, when yes program flow moves to step 222 where the problem indicator may be activated. When determination step 218 identifies that the number of clearing cycles has not met the threshold level, program flow moves to step 206 that identifies whether the temperature is still within the predetermined temperature range, when no program flow moves to step 224 where the temperature indicator is activated. When determination step 206 identifies that the temperature is within the predetermined temperature range, program flow moves back to step 214 where the load controller can perform an additional clearing cycle.

Note that program flow can move back to step 202 where additional sensor and measurement data are received after step 207, 222, and 224. Note also that program flow can move back to step 202 conditionally after determination step 212.

It is understood that the load being activated in step 212 and the indication to the user of state 210, 222, and 224 may be provided via an indicator or display at the apparatus of FIG. 1. Alternatively or additionally, information relating to sensed temperature, a problem, or other condition may be sent to and displayed on a remote device. In certain instances, at any point during operation a user may observe the thermal array characteristics using the thermal array 36 of FIG. 1.

Figure 3:
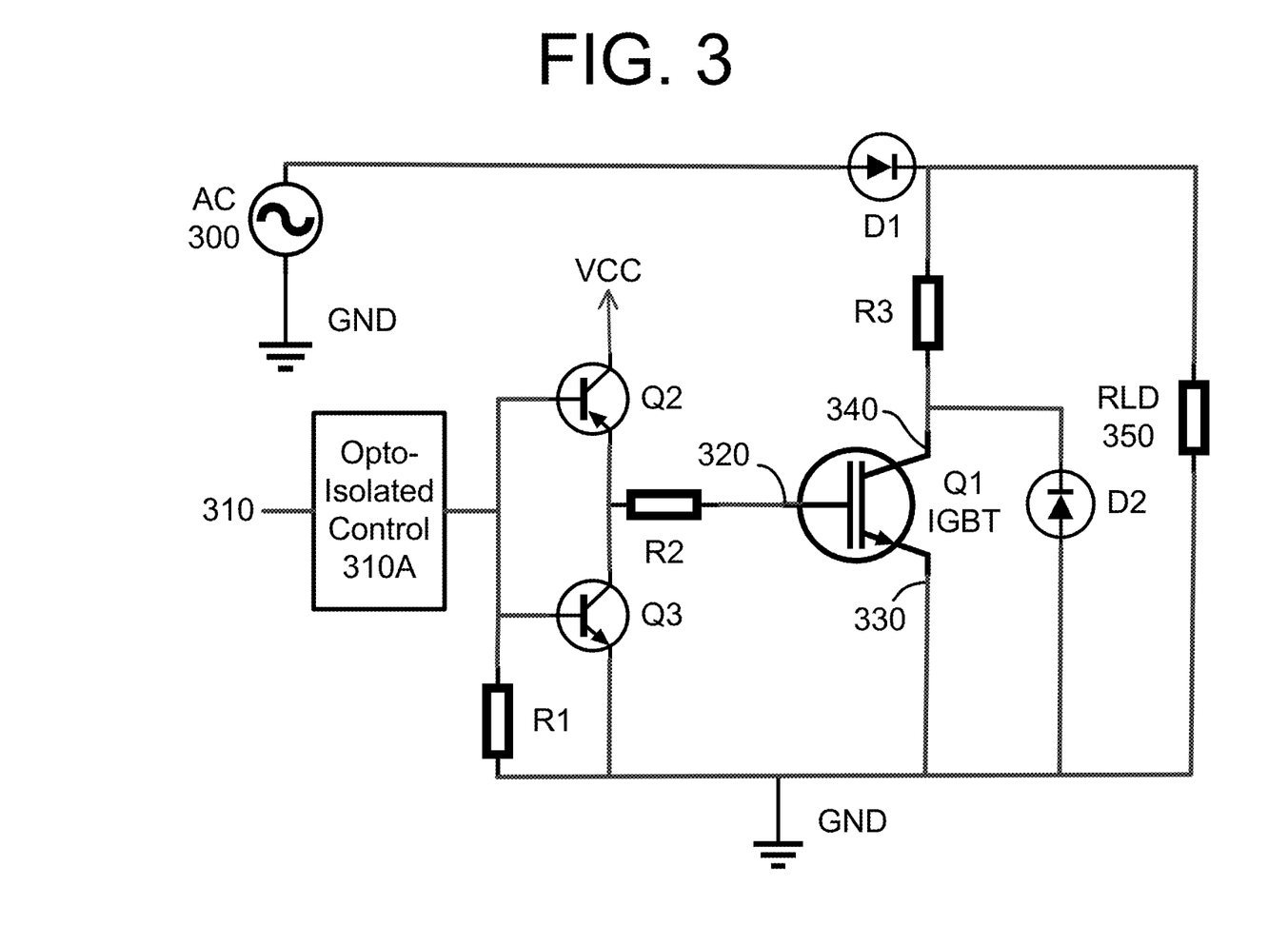
FIG. 3 illustrates a circuit that can be used to provide electrical power to a load based on the operation of an insulated gate bipolar transistor (IGBT).

FIG. 3 illustrates a circuit that can be used to provide electrical power to a load based on the operation of an insulated gate bipolar transistor (IGBT). FIG. 3 includes an alternating current (AC) voltage source 300, control input 310, an opto-isolated control transistor 310A, several transistors (Q1, Q2, & Q3), various resistors (R1, R2, R3, & RLD 350), and diodes (D1 & D2). Transistor Q1 is an IGBT with a gate input 320, an emitter 330, and a collector 340. The state of transistor Q1 is controlled by input 310 that is coupled to a set of components that include R1, Q2, Q2, and R2 that control a voltage on the gate 320 of IGBT Q1. Input 310 may be coupled to a pulse width modulation control circuit that can be used to provide power to a load based on a state associated with Q1. Depending on a state of input 310, IGBT Q1 is turned on or turned off and this action in turn affects how much load current is drawn from AC power source 300. Resistor R3 helps limit current flowing through transistor Q1. Diode D1 may also help limit when voltage is provided to R3 & RLD 350 and diode D2 helps shunt transients to ground when transistor Q1 switches. A total load current drawn from AC power source at a moment in time is a function of whether transistor Q1 is turned on, a resistance value of R3, and a resistance value of RLD 350. FIG. 3 also includes a direct current voltage VCC applied to transistor Q2 and ground connections GND.

Various methods may be used to control current flowing through a branch circuit. One method is to control the branch circuit within the predetermined fault currents by employing a single resistive element, array of resistive elements, a variable resistive element, or combination thereof. In the case of a very high fault current, the resistive elements are configured by microprocessor controlled switchable elements to further limit the current. A phase feedback or pulse width modulation can further interpolate desired current between fixed values determined by each loading element. A large number of commercially available circuit breakers are of a thermal-magnetic type, this type of circuit breaker can clear when either of 2 conditions is met. A first condition is associated with a sufficient amount of current or heat and a second condition is associated with the strength of magnetic fields, either of these conditions can cause a thermal-magnetic circuit breaker to open.

The first condition referred to above is when a sufficient amount of current passes thru the circuit breaker for a length of time so as to cause a bi-metallic element to heat and bend, once the bi-metallic element is sufficiently bent, a thermal-magnetic circuit breaker will open or clear. The current for a typical 15 or 20 amp breaker is generally specified to be at the rated current for several hours. As the current increases, the time to break the circuit decreases in an exponential fashion.

The second condition referred to above is when a sufficient amount of current flows thru the circuit breaker over a portion of a cycle. For example, within ½ power cycle (60 Hz in the U.S.) to cause two opposing magnetic fields to push open a set of contacts, breaking the circuit. Such a "magnetic trip" condition is generally set to occur at 10 times the rated current, which would be 150 or 200 amps for a 15 or 20 amp breaker respectively. Here, approximately 200 amps is sufficient to trip a 15 or 20 amp breaker within ½ cycle and limiting the amount of current to approximately 200 amps prevents excessive heating of the circuit elements. While the 15 or 20 circuit breakers are most common, this does not limit the operation of the apparatus to other specific configurations that may also be present such as 30, 40 or 50 amp circuit breakers. The 30 amp and higher circuit breakers are typically configured as multiple pole, split-phase or 3-phase, and a clearing condition on any one of the poles causes a clearing of all poles. An adapter with specific terminations can be used to adapt the receptacles associated with higher current circuit breakers for use with the single pole current control of the apparatus. A semi-conductive (semiconductor) device operating in the active region can be voltage or current controlled to change the load resistance as described above, an IBGT can be used to control a resistive load within a range of 0.10 and 0.20 ohms.

Another method for controlling branch circuit current is effective when a branch circuit has excessively high resistance. In such instances, a fault current (e.g. a current caused by a dead short) can be insufficient to clear the circuit breaker in the magnetic fashion. In these instances, a reactive element, that temporarily stores electrical energy in the form of a magnetic field (e.g. via an inductor) or static electric field (e.g. via a capacitor) is switched into the circuit allowing energy to build up in the reactive element. The reactive element can then be disconnected from the power circuit. During a subsequent portion of the power cycle determined to be most appropriate, the reactive element is then switched back into the circuit with same or different polarity such that an effective energy flow causes a temporary increase in effective current to reach the desired 150 A or 200 A trip point of a given circuit breaker. Here again this reactive element can be controllably connected to a load via a semi-conductor switching device.

Figure 4:
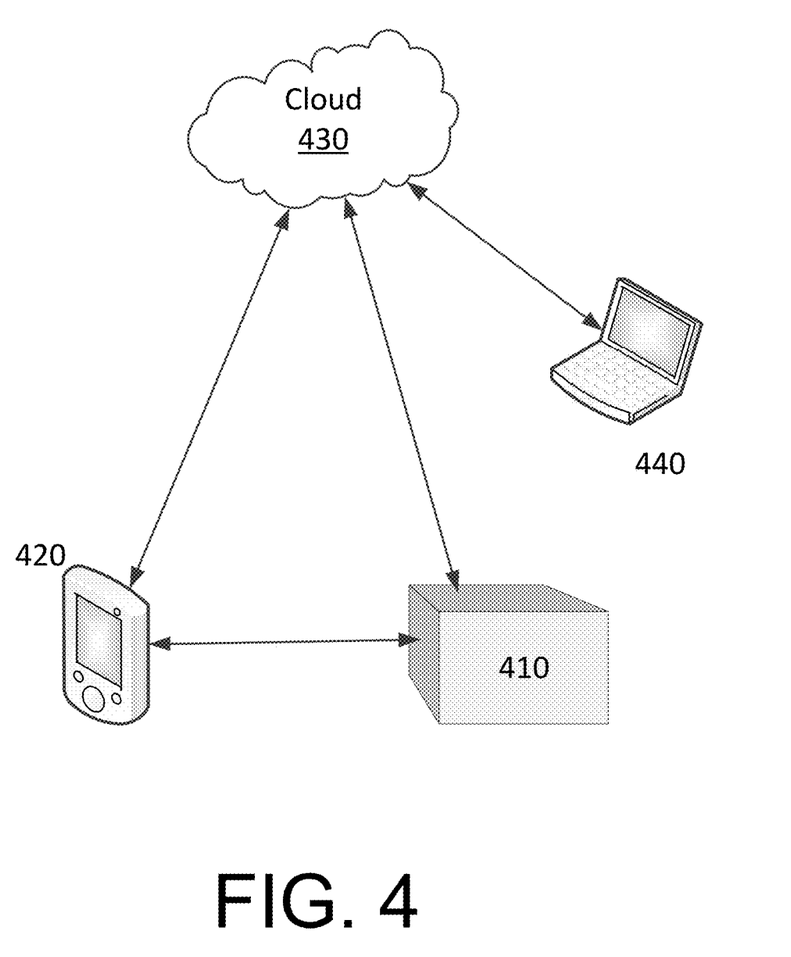
FIG. 4 illustrates a de-energizing device communicating with one or more remote electronic devices.

FIG. 4 illustrates a de-energizing device communicating with one or more remote electronic devices. FIG. 4 includes de-energizing device 410, mobile device 420, and computer 440. The de-energizing device 410 of FIG. 4 may be the same device illustrated in FIG. 1 that may evaluate characteristics of an electrical distribution circuit and that may be used to clear a circuit breaker. In certain instances, device 410 communicates with mobile device 420 using wireless communications and mobile device 410 may communicate with computer 440 via the cloud or Internet 430. In certain instances, data received from device 410 by mobile device 420 can be shared with computer 440. Alternatively, device 410 may communicate with computer 440 directly via the cloud or Internet 430. Each of the various communication pathways illustrated as double arrowed lines can be performed via a wireless communication interface or via a wired interface connection. Various wireless data communication types such as Bluetooth, 802.11 (Wi-Fi), cellular, or other wireless communication type.

When de-energizing device 410 communicates with external computing devices, these external computing devices may be able to perform the actuation of the current control from a remote location. This can occur after device 410 has been electrically connected to a particular branch circuit. By being able to communicate with remote devices, any data available or acquired by device 410 may be shared with one or more external computing devices. This may be to allow an operator to observe or measure a different portion of the circuit, or the circuit breaker itself for the effects of the controlled current draw when that user is on a ladder or in a different location from a location where the branch circuit resides.

By being able to remotely monitor and/or control the operation of de-energizing device 410 allows users be able to evaluate and clear branch circuits even when a receptacle that device 410 is attached to is partially obstructed or when that receptacle is in a difficult to reach area. A remote user interface at mobile device 420 or computer 440 can receive information from device 410 and that information can be displayed on a display of a remote computing device (e.g. device 420 or computer 440). The proliferation of cellular phones and other devices, such as wearable devices, with various types of built in radios makes the use of Wi-Fi or Bluetooth a compelling and cost effective choice as a remote monitor and/or activator of the load. Device 410 could also include a custom accessory for providing data to computer 440 directly via cloud or Internet 430. As such, devices consistent with the present disclosure may be controlled from across the room or from anywhere computer 440 resides.

Prior to, during, or after a controlled current draw has been performed, the user may wish to observe the effects on the circuit of interest. One way of achieving this is to incorporate a thermal imaging array so that a user may observe thermal characteristics of the circuit of interest. The array can be used to capture thermal data and data from such an array. The data can be used to build a picture of an area of the circuit of interest giving the user feedback to thermal variations and gradients that can be present before, during or after the load has been applied. In this way data associated with heated wires or heated loads can be used to identify thermal characteristics of interest. Examples of imaging arrays that can be used to collect thermal data include infrared thermal imaging detector arrays made by Heimann Sensor/Boston Electronics (e.g. HTPA 16×16d).

Figure 5:
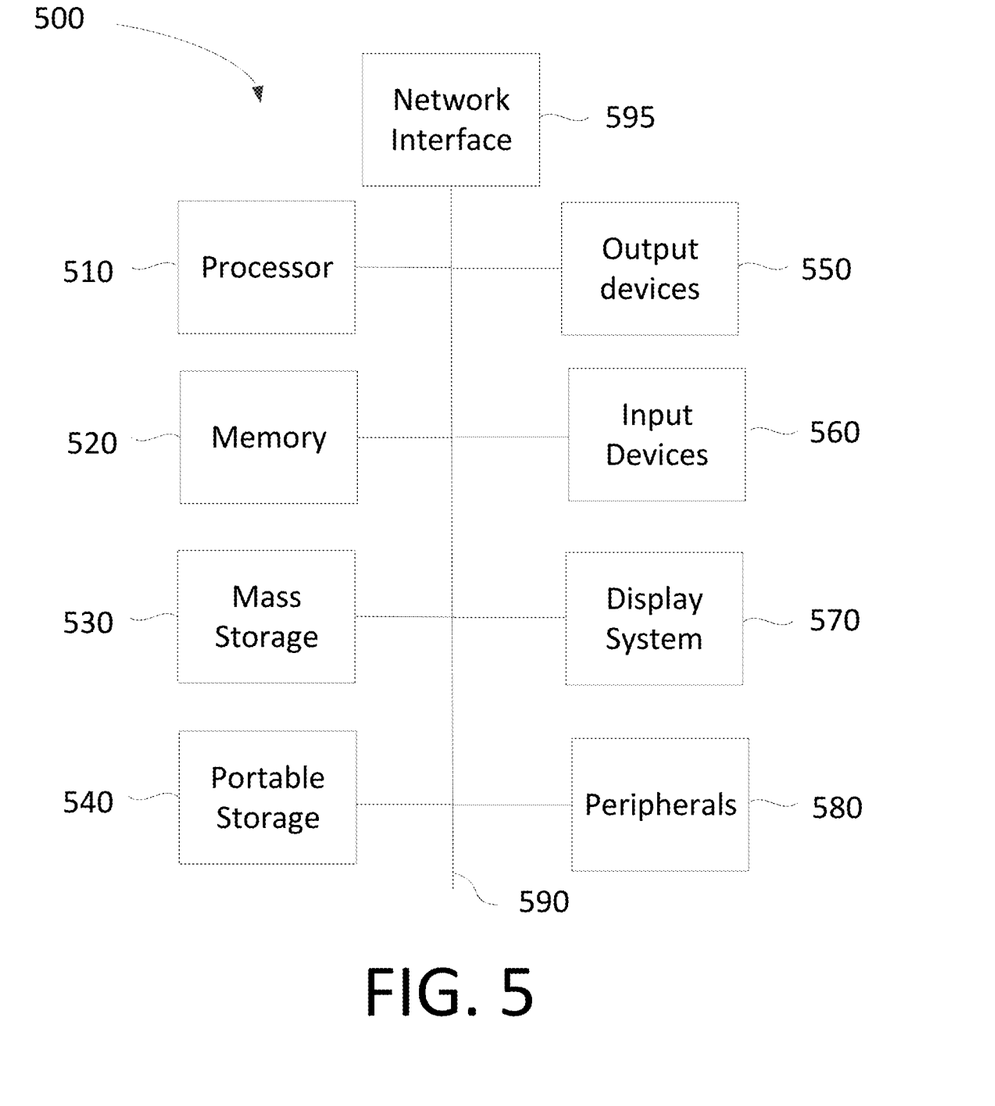
FIG. 5 illustrates a computing system that may implement aspects of the presently disclosed technology.

FIG. 5 illustrates a computing system that may implement aspects of the presently disclosed technology. The computing system 500 of FIG. 5 includes one or more processors 510 and main memory 520. Main memory 520 stores, in part, instructions and data for execution by processor 510. Main memory 520 can store the executable code when in operation. The system 500 of FIG. 5 further includes a mass storage device 530, portable storage medium drive(s) 540, output devices 550, user input devices 560, a graphics display 570, peripheral devices 580, and network interface 595.

The components shown in FIG. 5 are depicted as being connected via a single bus 590. However, the components may be connected through one or more data transport means. For example, processor unit 510 and main memory 520 can be connected via a local microprocessor bus, and the mass storage device 530, peripheral device(s) 580, portable storage device 540, and display system 570 can be connected via one or more input/output (I/O) buses.

Mass storage device 530, which can be implemented with a magnetic disk drive or an optical disk drive, is a non-volatile storage device for storing data and instructions for use by processor unit 510. Mass storage device 530 can store the system software for implementing the presently disclosed technology for purposes of loading that software into main memory 520.

Portable storage device 540 operates in conjunction with a portable non-volatile storage medium, such as a FLASH memory, compact disk or Digital video disc, to input and output data and code to and from the computer system 500 of FIG. 5. The system software for implementing the presently disclosed technology can be stored on such a portable medium and input to the computer system 500 via the portable storage device 540.

Input devices 560 provide a portion of a user interface. Input devices 560 can include an alpha-numeric keypad, such as a keyboard, for inputting alpha-numeric and other information, or a pointing device, such as a mouse, a trackball, stylus, or cursor direction keys. Additionally, the system 500 as shown in FIG. 5 includes output devices 550. Examples of suitable output devices include speakers, printers, network interfaces, and monitors.

Display system 570 can include a liquid crystal display (LCD), a plasma display, an organic light-emitting diode (OLED) display, an electronic ink display, a projector-based display, a holographic display, or another suitable display device. Display system 570 receives textual and graphical information, and processes the information for output to the display device. The display system 570 may include multiple-touch touchscreen input capabilities, such as capacitive touch detection, resistive touch detection, surface acoustic wave touch detection, or infrared touch detection. Such touchscreen input capabilities may or may not allow for variable pressure or force detection.

Peripherals 580 may include any type of computer support device to add additional functionality to the computer system. For example, peripheral device(s) 580 may include a modem or a router.

Network interface 595 can include any form of computer interface of a computer, whether that be a wired network or a wireless interface. As such, network interface 595 may be an Ethernet network interface, a Bluetooth™ wireless interface, an 802.11 interface, or a cellular phone interface.

The components contained in the computer system 500 of FIG. 5 are those typically found in computer systems that may be suitable for use with implementations of the presently disclosed technology and are intended to represent a broad category of such computer components that are well known in the art. Thus, the computer system 500 of FIG. 5 can be a personal computer, a hand held computing device, a telephone ("smart" or otherwise), a mobile computing device, a workstation, a server (on a server rack or otherwise), a minicomputer, a mainframe computer, a tablet computing device, a wearable device (such as a watch, a ring, a pair of glasses, or another type of jewelry/clothing/accessory), a video game console (portable or otherwise), an e-book reader, a media player device (portable or otherwise), a vehicle-based computer, some combination thereof, or any other computing device. The computer can also include different bus configurations, networked platforms, multiprocessor platforms, etc. The computer system 500 can in some cases be a virtual computer system executed by another computer system. Various operating systems can be used including Unix, Linux, Windows, Macintosh OS, Palm OS, Android, iOS, and other suitable operating systems.

The presently disclosed technology can be implemented in an application that may be operable using a variety of devices. Non-transitory computer-readable storage media refer to any medium or media that participate in providing instructions to a central processing unit (CPU) for execution. Such media can take many forms, including, but not limited to, non-volatile and volatile media such as optical or magnetic disks and dynamic memory, respectively. Common forms of non-transitory computer-readable media include, for example, a floppy disk, a flexible disk, a hard disk, magnetic tape, any other magnetic medium, a CD-ROM disk, digital video disk (DVD), any other optical medium, RAM, PROM, EPROM, a FLASH EPROM, and any other memory chip or cartridge.

While various flow diagrams provided and described above may show a particular order of operations performed by certain implementations of the presently disclosed technology, it should be understood that such order is exemplary (e.g., alternative implementations can perform the operations in a different order, combine certain operations, overlap certain operations, etc.).

What is claimed is:

1. A method for clearing a circuit breaker, the method comprising:
   receiving data associated with an electrical branch circuit;
   identifying, from the received data that a voltage value is within a first tolerance range;
   identifying, from the received data and responsive to identifying that the voltage value is within the first tolerance range, that a temperature value is within a second tolerance range;
   electrically connecting, responsive to the temperature value being within the second tolerance range, a load to an energized wire of the electrical branch circuit to clear the circuit breaker, wherein the load is based on operation of a power semiconductor device;
   receiving additional data associated with the electrical branch circuit; and
   identifying that the circuit breaker has cleared based on an evaluation of the additional data.

2. The method of claim 1, further comprising:
   measuring a first voltage at the energized wire before the load is electrically connected to the energized wire;
   measuring a second voltage at the energized wire when the load is electrically connected to the energized wire;
   identifying a voltage difference by subtracting the second voltage from the first voltage; and
   identifying an impedance of the electrical branch circuit after identifying the voltage difference.

3. The method of claim 2, further comprising identifying that the impedance is within a third tolerance range, wherein the load is electrically connected based at least in part on the impedance being within the third tolerance range.

4. The method of claim 1, further comprising electrically disconnecting the load from the energized wire during at least a portion of a cycle of an alternating current voltage source.

5. The method of claim 1, further comprising:
   measuring a second temperature value; and
   electrically disconnecting the load from the energized wire based on the second temperature value at least meeting a threshold level.

6. The method of claim 5, further comprising activating a temperature indicator based on the second temperature value at least meeting the threshold level.

7. The method of claim 1, further comprising measuring a voltage at the energized wire of the electrical branch circuit.

8. The method of claim 1, further comprising:
   performing a number of cycles of electrically disconnecting and connecting the load to the energized wire;
   identifying that the circuit breaker has not cleared; and
   performing an action based on an identification that the circuit breaker has not cleared.

9. The method of claim 8, wherein the action includes activating a problem indicator.

10. The method of claim 8, wherein the action includes delaying electrically reconnecting the load to the energized wire until after a first time period has passed.

11. The method of claim 10, further comprising connecting a second load to the energized wire after the first time period, wherein the circuit breaker is cleared after a connection of the second load.

12. The method of claim 8, further comprising providing electrical energy collected from a thermoelectric device when the circuit breaker is cleared.

13. The method of claim 1, further comprising:
   sending information relating to the received data for display on an external electronic device; and
   receiving a command to initiate clearing the circuit breaker from the external electronic device.

14. One or more tangible non-transitory computer-readable storage media storing computer-executable instructions for performing a computer process on a computing system, the computer process comprising:
receiving data associated with an electrical branch circuit; identifying, from the received data, that:
a voltage value is within a first tolerance range, and
a temperature value is within a second tolerance range;
electrically connecting, responsive to the voltage value being within the first tolerance range and the temperature value being within the second tolerance range, a load to an energized wire of the electrical branch circuit to clear a circuit breaker, wherein the load is electrically connected based on operation of a power semiconductor device;
receiving additional data associated with the electrical branch circuit; and
identifying that the circuit breaker has cleared based on an evaluation of the additional data.

15. The one or more tangible non-transitory computer-readable storage media of claim 14, the computer process further comprising:
measuring a first voltage at the energized wire before the load is electrically connected to the energized wire;
measuring a second voltage at the energized wire when the load is electrically connected to the energized wire;
identifying a voltage difference by subtracting the second voltage from the first voltage; and
identifying an impedance of the electrical branch circuit after identifying the voltage difference.

16. The one or more tangible non-transitory computer-readable storage media of claim 15, the computer process further comprising identifying that the impedance is within a third tolerance range, wherein the load is electrically connected based at least in part on the impedance being within the third tolerance range.

17. The one or more tangible non-transitory computer-readable storage media of claim 14, the computer process further comprising electrically disconnecting the load from the energized wire during at least a portion of a cycle of an alternating current voltage source.

18. An apparatus for clearing a circuit breaker, the apparatus comprising:
a sensor configured to sense data associated with an electrical branch circuit;
a load;
a semiconductor device configured to electrically connect the load to an energized wire of the electrical branch circuit; and
an electronic controller configured to:
receive the sensed data;
identify, from the sensed data, that a voltage value is within a first tolerance range;
identify, from the sensed data and at least partly responsive to identifying that the voltage value is within the first tolerance range, that a temperature value is within a second tolerance range;
electrically connect, at least partly responsive to identifying that the temperature value is within the second tolerance range, the load to the energized wire to clear the circuit breaker;
evaluate additional data associated with the electrical branch circuit; and
identify that the circuit breaker has cleared based on an evaluation of the additional data.

19. The apparatus of claim 18, wherein the electronic controller also is further configured to:
measure a first voltage at the energized wire before the load is electrically connected to the energized wire;
measure a second voltage at the energized wire when the load is electrically connected to the energized wire;
identify a voltage difference by subtracting the second voltage from the first voltage; and
identify an impedance of the electrical branch circuit after identifying the voltage difference.

20. The apparatus of claim 18, further comprising a plurality of different loads, wherein the electronic controller controls which of the plurality of different loads are electrically connected to the energized wire when the circuit breaker is cleared.

* * * * *